United States Patent
Tu

(10) Patent No.: US 10,510,811 B2
(45) Date of Patent: Dec. 17, 2019

(54) COLOR FILTER AND WHITE ORGANIC LIGHT-EMITTING DIODE DISPLAY APPARATUS

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Aiguo Tu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/945,149

(22) Filed: Apr. 4, 2018

(65) Prior Publication Data
US 2019/0206943 A1 Jul. 4, 2019

Related U.S. Application Data

(63) Continuation of application No. PCT/CN2018/073096, filed on Jan. 17, 2018.

(30) Foreign Application Priority Data

Dec. 29, 2017 (CN) .......................... 2017 1 1483314

(51) Int. Cl.
*H01L 27/32* (2006.01)

(52) U.S. Cl.
CPC ........ *H01L 27/322* (2013.01); *H01L 27/3213* (2013.01); *H01L 27/3216* (2013.01); *H01L 27/3218* (2013.01)

(58) Field of Classification Search
CPC .............. H01L 27/322; H01L 27/3213; H01L 27/3216; H01L 27/3218
(Continued)

(56) References Cited

U.S. PATENT DOCUMENTS

| 2009/0096764 A1* | 4/2009 | You ....................... G06F 3/0412 345/174 |
| 2014/0103368 A1* | 4/2014 | Hatano ............... H01L 27/3246 257/88 |

(Continued)

FOREIGN PATENT DOCUMENTS

| CN | 202049252 U | 11/2011 |
| CN | 104600097 A | 5/2015 |

(Continued)

*Primary Examiner* — Long K Tran
(74) *Attorney, Agent, or Firm* — Hemisphere Law, PLLC; Zhigang Ma

(57) ABSTRACT

The present invention disclosures a color filter used for a WOLED display apparatus. The color filter includes a red pixel section, a green pixel section, a blue pixel section and a white pixel section. A red photoresist is disposed in the red pixel section, a green photoresist is disposed in the green pixel section, and a blue photoresist is disposed in the blue pixel section. The white pixel section includes a first sub-section, and a red photoresist, a green photoresist or a blue photoresist is disposed in the first sub-section. The present invention further disclosures a WOLED display apparatus including above color filter. The color filter of the present invention can reduce a Y value of chromaticity coordinate of the white pixel. Required brightness of the monochromatic pixels drops at a white image and power consumption is reduced. Accordingly, the life of display devices rises.

18 Claims, 3 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2015/0028309 A1 | 1/2015 | Ono et al. | |
| 2016/0307493 A1* | 10/2016 | Song | ................... G09G 3/2003 |
| 2016/0343789 A1* | 11/2016 | Shi | ......................... H01L 51/52 |
| 2018/0122874 A1* | 5/2018 | Kim | ....................... G02B 5/223 |

FOREIGN PATENT DOCUMENTS

| | | |
|---|---|---|
| CN | 104835830 A | 8/2015 |
| CN | 105679798 A | 6/2016 |
| WO | 2013/099744 A1 | 7/2013 |

* cited by examiner

COLOR FILTER AND WHITE ORGANIC LIGHT-EMITTING DIODE DISPLAY APPARATUS

RELATED APPLICATIONS

The present application is a Continuation Application of International Application Number PCT/CN2018/073096, filed Jan. 17, 2018, and claims the priority of China Application No. 201711483314.1, filed Dec. 29, 2017.

FIELD OF THE DISCLOSURE

The present disclosure relates to a technical field of display, and more particularly, to a color filter for a white organic light-emitting diode display apparatus, and a white organic light-emitting diode display apparatus.

BACKGROUND

Organic Light Emitting Diode (OLED) has a self-luminous feature, and uses a very thin organic material coating layer and a glass substrate. When currents pass through it, organic material will be luminous. Furthermore, the visible angle of an OLED screen is large and OLEDs significantly save power, thus OLEDs is more and more widely applied at present.

The core element of an OLED display apparatus is an OLED display panel, usually comprising: a Thin Film Transistor (TFT) array substrate and layers in turn disposed on the TFT substrate, which are an anode layer, a pixel definition layer, a first common layer for transmitting holes, an active layer, a second common layer for transmitting electrons and a cathode layer. The operating mechanism of an OLED display panel is the fact that the holes are transmitted to the active layer via the first common layer, and the electrons are transmitted to the active layer via the second common layer, then they recombines at the active layer to emit light.

For implementing full-color of an OLED display apparatus, one way is through the stack of White Organic Light Emitting Diodes (WOLEDs) and Color Filters (CFs). Wherein, high resolution of an OLED display could be accomplished without requiring accurate mask process in stack structure of WOLEDs and CFs, which is wider one of applications. Pixels of WOLEDs products consist of red, green, blue and white pixels, wherein red, green and blue light are emitted from red, green, and blue pixels by means of white light from WOLED devices passing through red, green, blue filters. Therefore, when there is a requirement of white light in this kind of product, white light pixels is lighting. The color point for a white pixel of WOLED is actually not the target white point appeared on a display panel, generally, WOLED light is hardly the same as the standard of white point in products. Therefore, it is required that one or two kinds of color sub-pixels emit corresponding light with specific ratio to combine with light from white pixels, so as to gain the white point of products (chromaticity coordinate of the white image).

A Y value of chromaticity coordinate is large for the white light with more components of yellow light emitted directly from WOLED devices, which needs higher brightness monochromatic light (e.g., blue light and red light, or blue light and green light) when color matching of white image is proceeding, accordingly the life of devices is reduced.

SUMMARY

In view of the shortcoming of the prior art, the disclosure provides a color filter applied in a White Organic Light Emitting Diodes display apparatus, which can reduce a Y value of chromaticity coordinate of the white pixel. Required brightness of the monochromatic pixels drops at a white image and power consumption is reduced. Accordingly, the life of display devices rises.

To achieve above purpose, following schemes are adopted in the present invention:

A color filter is used for a WOLED display apparatus, wherein the color filter includes a red pixel section, a green pixel section, a blue pixel section and a white pixel section. A red photoresist is disposed in the red pixel section, a green photoresist is disposed in the green pixel section, and a blue photoresist is disposed in the blue pixel section. The white pixel section includes a first sub-section, and a red photoresist, a green photoresist or a blue photoresist is disposed in the first sub-section, Wherein an area of the first sub-section is within the range of 5%~25% of the area of the white pixel section.

Wherein an area of the first sub-section is 12.5% of the area of the white pixel section.

Wherein the first sub-section has a form of long strip, the first sub-section extends along a length direction of the white pixel section and a length of the first sub-section is the same as that of the white pixel section.

Wherein the white pixel section further includes a second sub-section. There is a red photoresists, a green photoresist or a blue photoresist disposed in the second sub-section. A color of the photoresist in the second sub-section is different from that of the photoresist in the first sub-section.

Wherein a blue photoresist is disposed in the first sub-section and a red photoresist is disposed in the second sub-section.

Wherein an area sum of the first sub-section and the sub-section is 5%~25% of area of the white pixel section.

Wherein an area of the second sub-section is the same as that of the first sub-section.

Wherein the second sub-section has a form of a long strip structure, the second sub-section extends along a length direction of the white pixel section and a length of the second sub-section is the same as that of the white pixel section.

The present invention further provides an OLED display apparatus, and the OLED display apparatus includes a display panel and a color filter disposed on the display panel. Wherein the display panel is a WOLED display panel, and the color filter is, for example, one of above-mentioned color filters.

the color filters provided by embodiments of the present invention corrects spectra of the white pixels, by means of disposing a red photoresist, a green photoresist or a blue photoresist in the first sub-section of white pixel section, accordingly, a Y value of chromaticity coordinate of the white pixel is reduced. When it is applied in a WOLED display apparatus, with the drop in Y value of chromaticity coordinate of the white pixel, required brightness of the monochromatic pixels drops correspondingly and power consumption is reduced. Accordingly, life of the monochromatic pixels rises and the usage life of entire display panel rises.

BRIEF DESCRIPTION OF THE DRAWINGS

To more clearly illustrate embodiments of the application or technical solutions in the prior art, drawings to be used in the description of the embodiments of the application or the prior art will be briefly introduced hereinafter. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

In order to understand the above objectives, features and advantages of the present disclosure more clearly, the present disclosure is described in detail below with references to the accompanying drawings and specific embodiments. It should be understood that the specific embodiments described herein only to explain the present invention and are not intended to limit the present invention.

Herein, it should further be clarified that accompany figures merely show the structure and/or process closely relative to schemes according to the present invention and other details not closely relative to the present invention is omitted, so as to prevent unnecessary details from obscuring the present invention.

Embodiment 1

Figure 1:
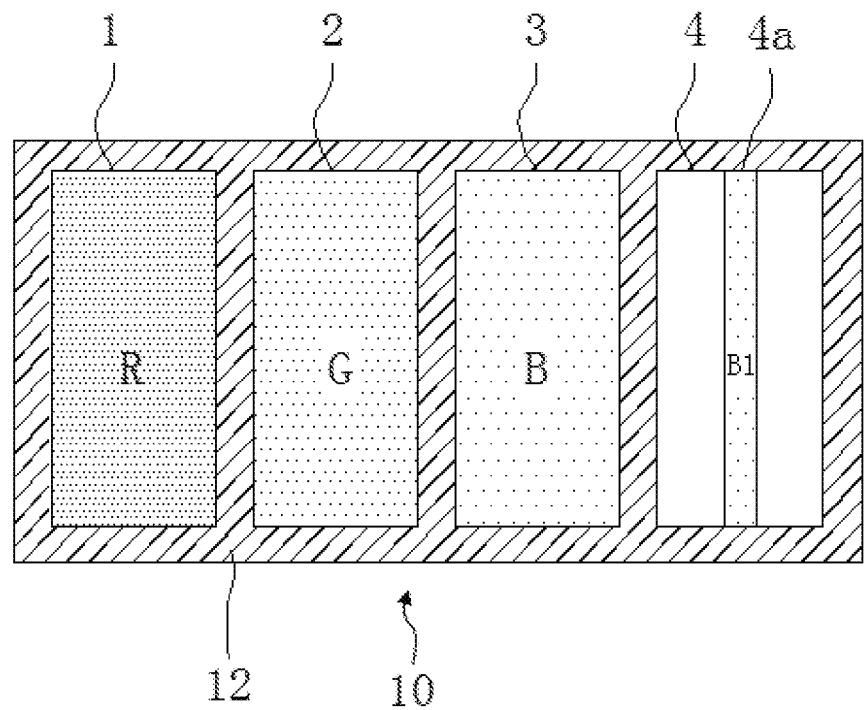
FIG. 1 is a schematic illustrating plane structure of a color filter according to embodiment 1 of the present invention.

The present embodiment provides a color filter applied in a WOLED apparatus. As shown in FIG. 1, the color filter 10 includes a red pixel section 1, a green pixel section 2, a blue pixel section 3 and a white pixel section 4. A red photoresist R is disposed in the red pixel section 1, a green photoresist G is disposed in the green pixel section 2, and a blue photoresist B is disposed in the blue pixel section 3. The white pixel section 4 includes a first sub-section 4a, and an arbitrary monochromatic photoresist is disposed in the first sub-section 4a, which may specifically be a red photoresist, a green photoresist or a blue photoresist. In the present embodiment, as shown in FIG. 1, there is a blue photoresist B1 disposed in the first sub-section 4a.

Figure 2:
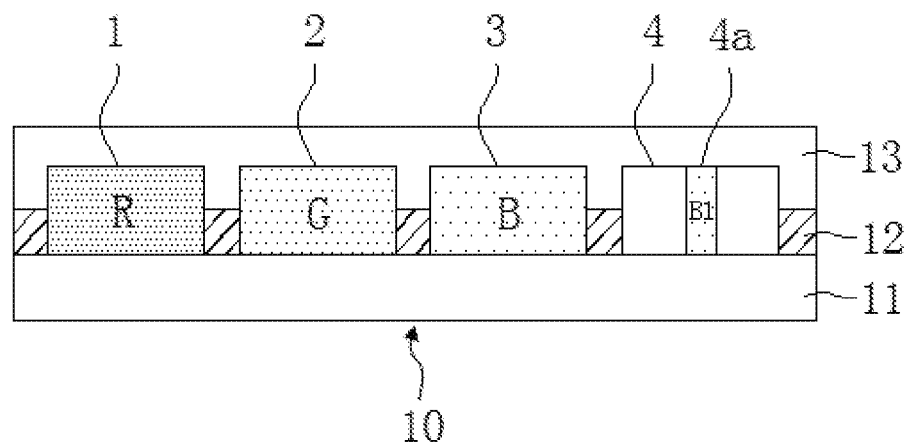
FIG. 2 is a schematic illustrating section structure of a color filter according to embodiment 1 of the present invention.

Specifically, referring to FIG. 1 and FIG. 2, the color filter 10 includes a pixel definition array 12 formed on a glass substrate 11. The definition array 12 defines the red pixel section 1, the green pixel section 2, the blue pixel section 3 and the white pixel section 4. The red pixel section 1, the green pixel section 2, the blue pixel section 3 and the white pixel section 4 are orderly arranged to form a pixel cell (FIG. 1 and FIG. 2 are schematic illustrating one of pixel cells). The red photoresist R, the green photoresist G, and the blue photoresist B are correspondingly disposed in the red pixel section 1, the green pixel section 2, the blue pixel section 3 are spaced apart from each other by the definition array 12. In the white pixel section 4, except for the blue resist B1 photoresist disposed in the first sub-section 4a, there is no need to dispose any photoresist in the rest of section. Further, a protection film layer is further disposed on the glass substrate 11, and the protection film layer 13 covers the definition array 12 and each the color pixel section.

For the color filter provided by above-mentioned embodiment, spectrum correction of white pixel is accomplished by means of disposing one arbitrary monochromatic photoresist in the first sub-section 4a of the white pixel section 4, thus a Y value of chromaticity coordinate of the white pixel is reduced. Wherein, the disposed monochromatic photoresist preferably is a blue photoresist, secondly is a red photoresist, and thirdly is a green photoresist.

Wherein, referring to FIG. 1 and FIG. 2, in the white pixel section 4, an area of the first sub-section 4a is 12.5% of the area of the white pixel section 4, accordingly, an area of the blue photoresist B1 is 12.5% of the area of the white pixel section 4. In other embodiments an area of the first sub-section 4a may be within the range of 5%~25% of the area of the white pixel section 4.

Wherein, a shape of the first sub-section 4a may be arbitrary, and it only requires controlling the area ratio between the first sub-section 4a and the white pixel section 4. In the present embodiment, as shown in FIG. 1, the first sub-section 4a has a form of long strip, and the first sub-section 4a extends along a length direction of the white pixel section 4. A length of the first sub-section 4a is the same as that of the white pixel section 4. Generally, all the color photoresists in the color filter are manufacture via patterning process. The first sub-section 4a is designed as a regular strip structure and a length of the first sub-section 4a is the same as that of the white pixel section 4, thus a shape of the disposed photoresist in the first sub-section 4a is more closely to other color photoresists (the red photoresists R, the green photoresists G, and the blue photoresists B), accordingly, the difficulty of patterning process is reduced.

Embodiment 2

The present embodiment provides a color filter, and there are two different color photoresists disposed in the white pixel section 4, which is different from embodiment 1.

Figure 3:
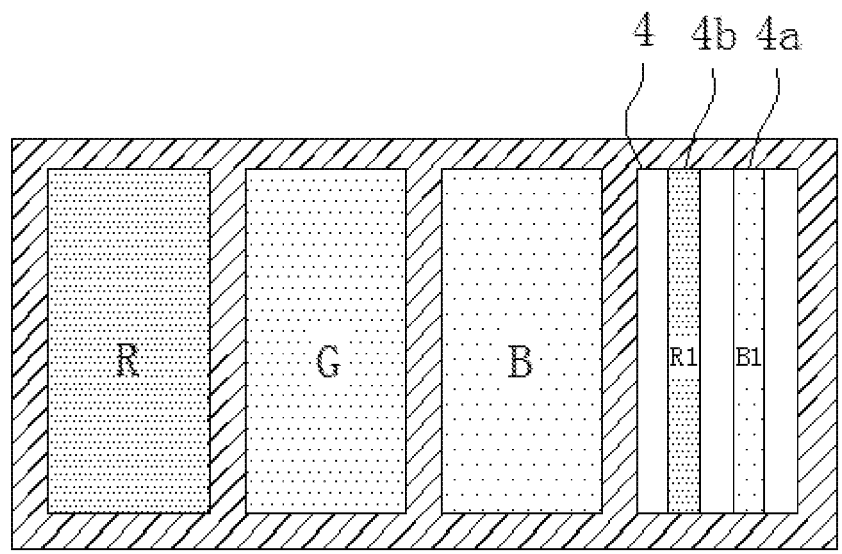
FIG. 3 is a schematic illustrating plane structure of a color filter according to embodiment 2 of the present invention.

Specifically, in the present embodiment shown in FIG. 3, the white pixel section 4 further includes a second sub-section 4b, that is, the white pixel section 4 includes a first sub-section 4a and a second sub-section 4b. Wherein, there is a red photoresists, a green photoresist or a blue photoresist disposed in the first sub-section 4a, and there is a red photoresists, a green photoresist or a blue photoresist disposed in the second sub-section 4b. A color of the photoresist in the second sub-section 4b is different from that of the photoresist in the first sub-section 4a. That is to say, arbitrary two of a red photoresist, a green photoresist and a blue photoresist are selected to be disposed in the first sub-section 4a and the second sub-section 4b. In the present embodiment, as shown in FIG. 3, a blue photoresist B1 is disposed in the first sub-section 4a and a red photoresist R1 is disposed in the second sub-section 4b.

Similar to the embodiment 1, spectrum correction of white pixel is accomplished by means of disposing two different monochromatic photoresists in the first sub-section 4a and the second sub-section 4b of the white pixel section 4, thus a Y value of chromaticity coordinate of the white pixel is reduced.

Wherein, a shape of the first sub-section 4a and the second sub-section 4b may be arbitrary, and it only requires controlling the area ratio between the first sub-section 4a and the white pixel section 4. Specifically, an area sum of the first sub-section 4a and the sub-section 4b is 5%~25% of area of the white pixel section 4. From a preferable scheme, an area of the first sub-section 4a is the same as that of the second sub-section 4b.

Similar to the embodiment 1, in the present embodiment shown in FIG. 3, in order to reduce the patterning process difficulty of photoresist patterns, the second sub-section 4b is form of a long strip structure, the second sub-section 4b extends along a length direction of the white pixel section 4 and a length of the second sub-section 4b is the same as that of the white pixel section 4.

The rest structures of the color filter in the present embodiment are the same as that of embodiment 1, which will not be repeated here again.

Embodiment 3

Figure 4:
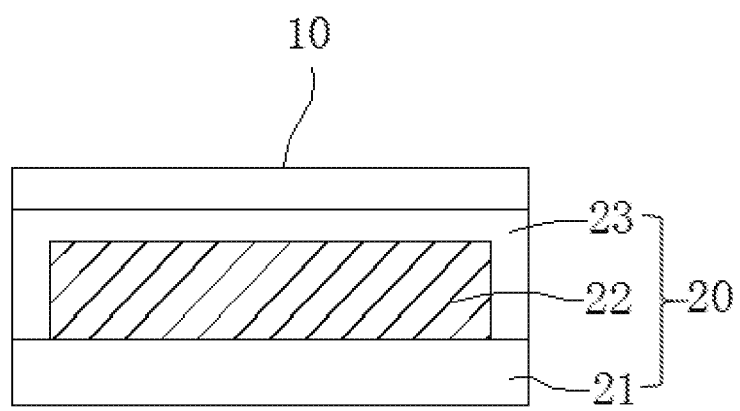
FIG. 4 is a schematic illustrating structure of a WOLED display apparatus according to embodiment 3 of the present invention.

The present embodiment provides an OLED display apparatus as shown in FIG. 4, and the OLED display apparatus includes a display panel 20 and a color filter 10 disposed on the display panel 20. Wherein, the display panel 20 is a WOLED display panel, and the color filter 10 is, for example, one illustrated in above-mentioned embodiment 1 or embodiment 2.

Wherein, as shown in FIG. 4, the WOLED display panel 20 includes a TFT array substrate 21 and an active structured layer 22 on the TFT array substrate 21. A packing layer 23 covers over the active structured layer 22. The color filter 10 is disposed on the packing layer 23.

Figure 5:
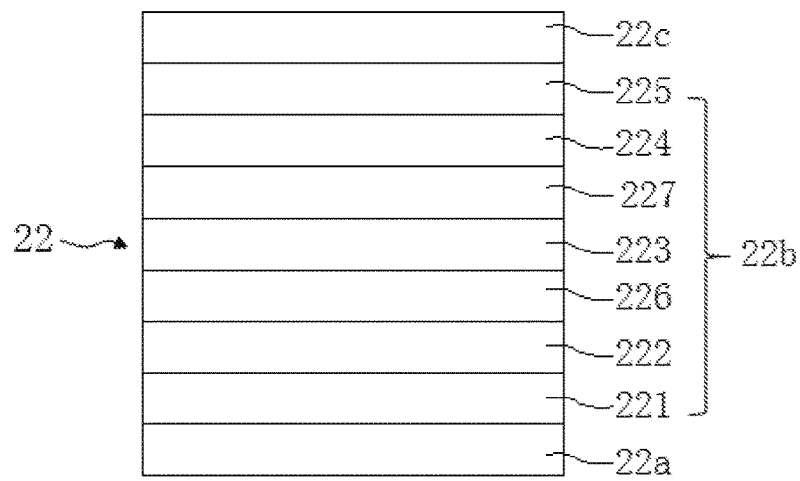
FIG. 5 is a schematic illustrating structure of a active structured layer according to embodiment 3 of the present invention.

Specifically, as shown in FIG. 5, the active structured layer 22 includes, orderly arranged, an anode layer 22a, a white organic light emitting layer 22b, and a cathode layer 22c. The white organic light emitting layer 22b includes, a first common layer 221 for transmitting holes, a blue emissive layer (B-EML) 222, a yellow emissive layer (Y-EML) 223, a blue emissive layer (B-EML) 224, and a second common layer 225 for transmitting electrons, orderly arranged on the anode layer 22a. Wherein, the first common layer 221 includes a hole injection layer (HIL) and a hole transport layer (HTL), further a disposed electron blocking layer, in turn arranged in a direction away from the anode layer 22a; the second common layer 225 includes a electron injection layer (EIL) and a electron transport layer (ETL), further a hole blocking layer, in turn arranged in a direction away from the cathode layer 22c. Further, a charge generate layers 226, 227 is disposed between the B-EML 222 and the Y-EML 223 as well as between the Y-EML 223 and the B-EML 224. The charge generate layers 226, 227 both include an N-type charge generate layer and a P-type charge generate layer. Front of the N-type charge generate layer, a ETL is further included, and behind the P-type charge generate layer, a HTL is further included and a electron blocking is yet included.

Figure 6:
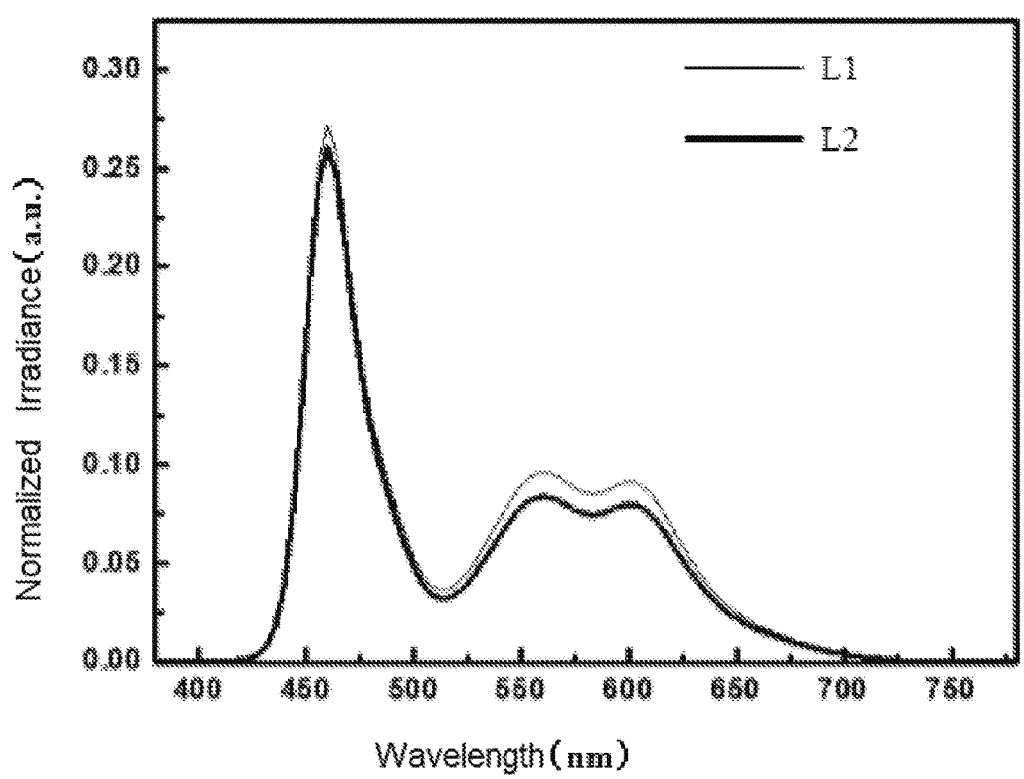
FIG. 6 is a schematic illustrating spectrum of a WOLED display apparatus.

FIG. 6 is a schematic illustrating the spectra of a WOLED display apparatus. A curve L1 in the FIG. 6 represents a spectrum curve with traditional color filters and a curve L2 represents a spectrum curve with color filters provided by embodiments of the present invention, specifically with the color filter provided by embodiment 1.

As shown in FIG. 6, when adopted, a traditional color filter is corresponding to the spectrum curve L1, of which chromaticity coordinate of white pixel is (0.3152, 0.3059). When adopted, the color filter provided by embodiment 1 is corresponding to the spectrum curve L2, of which chromaticity coordinate of white pixel is (0.2953, 0.2771). From above, it shows that a value of chromaticity coordinate is significantly reduced when the color filter provided by embodiments of the present invention is adopted. At the moment, a chromaticity coordinate of white image in the display apparatus is set as (0.28, 0.29) and display brightness is 150 nits, then required brightness of monochromatic blue light drops to 4.014 Cd/m2 from 5.029 Cd/m2, Then in a 55-Inch 4K display apparatus, power consumption drops to 221.8 W from 240.7 W, by 7.85% and a life of the monochromatic blue pixels rises to 35860 hours from 22940 hours.

In conclusion, the color filters provided by embodiments of the present invention corrects spectra of the white pixels, by means of disposing a red photoresist, a green photoresist or a blue photoresist in the first sub-section of white pixel section, accordingly, a Y value of chromaticity coordinate of the white pixel is reduced. When it is applied in a WOLED display apparatus, with the drop in Y value of chromaticity coordinate of the white pixel, required brightness of the monochromatic pixels drops correspondingly and power consumption is reduced. Accordingly, life of the monochromatic pixels rises and the usage life of entire display panel rises.

It should be explained that the relationship terms, such as first and second, etc., in the present application are only used for distinguishing one entity or operation from another entity or operation without requiring or implying any actual relation or sequence existing between these entities or operations. It should also be noted that the terms "comprise", "include" and any other variations thereof intend to cover nonexclusive inclusion so that the procedure, the method, the product or the equipment including a series of elements include not only these elements, but also other elements which are not listed explicitly, or also include inherent elements of these procedure, method, product or equipment.

Above, with accompanying drawings, describes the embodiments of the present application, however the present application is not limited to above specific embodiments. The above-mentioned specific implementations are merely illustrative and can not be construed as a limitation. Those skilled in the art can make numerous modifications without departing from the gist of the method and the scope of the claims, which all belong to the scope of the present disclosure.

What is claimed is:

1. A color filter is used for a WOLED display apparatus, comprising: a red pixel section, a green pixel section, a blue pixel section and a white pixel section;
    wherein a red photoresist is disposed in the red pixel section, a green photoresist is disposed in the green pixel section, and a blue photoresist is disposed in the blue pixel section; and
    wherein the white pixel section includes a first sub-section, and a red photoresist, a green photoresist or a blue photoresist is disposed in the first sub-section; and
    wherein the white pixel section further includes a second sub-section, there is a red photoresists, a green photoresist or a blue photoresist disposed in the second sub-section, and a color of the photoresist in the second sub-section is different from that of the photoresist in the first sub-section.

2. The color filter according to claim 1, wherein an area of the first sub-section is within the range of 5%~25% of the area of the white pixel section.

3. The color filter according to claim 2, wherein an area of the first sub-section is 12.5% of the area of the white pixel section.

4. The color filter according to claim 1, wherein the first sub-section has a form of long strip, the first sub-section extends along a length direction of the white pixel section and a length of the first sub-section is the same as that of the white pixel section.

5. The color filter according to claim 1, wherein a blue photoresist is disposed in the first sub-section and a red photoresist is disposed in the second sub-section.

6. The color filter according to claim 1, wherein an area sum of the first sub-section and the sub-section is 5%~25% of area of the white pixel section.

7. The color filter according to claim 6, wherein an area of the first sub-section is 12.5% of the area of the white pixel section and an area of the second sub-section is 12.5% of the area of the white pixel section.

8. The color filter according to claim 1, wherein the first sub-section has a form of long strip, the first sub-section extends along a length direction of the white pixel section and a length of the first sub-section is the same as that of the white pixel section.

9. The color filter according to claim 1, wherein the second sub-section has a form of a long strip structure, the second sub-section extends along a length direction of the white pixel section and a length of the second sub-section is the same as that of the white pixel section.

10. A WOLED display apparatus, comprising a display panel and a color filter disposed on the display panel;
wherein the display panel is a WOLED display pane;
wherein the color filter comprises a red pixel section, a green pixel section, a blue pixel section and a white pixel section, a red photoresist is disposed in the red pixel section, a green photoresist is disposed in the green pixel section, and a blue photoresist is disposed in the blue pixel section;
wherein the white pixel section includes a first sub-section, and a red photoresist, a green photoresist or a blue photoresist is disposed in the first sub-section; and
wherein the white pixel section further includes a second sub-section, there is a red photoresists, a green photoresist or a blue photoresist disposed in the second sub-section, and a color of the photoresist in the second sub-section is different from that of the photoresist in the first sub-section.

11. The WOLED display apparatus according to claim 10, wherein an area of the first sub-section is within the range of 5%~25% of the area of the white pixel section.

12. The WOLED display apparatus according to claim 11, wherein an area of the first sub-section is 12.5% of the area of the white pixel section.

13. The WOLED display apparatus according to claim 10, wherein the first sub-section has a form of long strip, the first sub-section extends along a length direction of the white pixel section and a length of the first sub-section is the same as that of the white pixel section.

14. The WOLED display apparatus according to claim 10, wherein a blue photoresist is disposed in the first sub-section and a red photoresist is disposed in the second sub-section.

15. The WOLED display apparatus according to claim 10, wherein an area sum of the first sub-section and the sub-section is 5%~25% of area of the white pixel section.

16. The WOLED display apparatus according to claim 15, wherein an area of the first sub-section is 12.5% of the area of the white pixel section and an area of the second sub-section is 12.5% of the area of the white pixel section.

17. The WOLED display apparatus according to claim 10, wherein the first sub-section has a form of long strip, the first sub-section extends along a length direction of the white pixel section and a length of the first sub-section is the same as that of the white pixel section.

18. The WOLED display apparatus according to claim 10, wherein the second sub-section has a form of a long strip structure, the second sub-section extends along a length direction of the white pixel section and a length of the second sub-section is the same as that of the white pixel section.

* * * * *